(12) United States Patent
Kannengiesser et al.

(10) Patent No.: US 7,821,262 B2
(45) Date of Patent: Oct. 26, 2010

(54) METHOD AND APPARATUS FOR SENSITIVITY-ENCODED MAGNETIC RESONANCE IMAGING USING AN ACQUISITION COIL ARRAY

(75) Inventors: Stephan Kannengiesser, Erlangen (DE); Ralf Loeffler, Cordova, TN (US); Edgar Mueller, Heroldsbach (DE); Peter Schmitt, Weisendorf (DE)

(73) Assignee: Siemens Aktiengesellschaft, Munich (DE)

( * ) Notice: Subject to any disclaimer, the term of this patent is extended or adjusted under 35 U.S.C. 154(b) by 713 days.

(21) Appl. No.: 11/753,691

(22) Filed: May 25, 2007

(65) Prior Publication Data

US 2008/0139919 A1 Jun. 12, 2008

(30) Foreign Application Priority Data

May 29, 2006 (DE) .................. 10 2006 024 976

(51) Int. Cl.
*G01V 3/00* (2006.01)
(52) U.S. Cl. ..................................... 324/307; 324/309
(58) Field of Classification Search ......... 324/300–322; 600/407–445
See application file for complete search history.

(56) References Cited

U.S. PATENT DOCUMENTS

| 5,329,598 A * | 7/1994 | Geist .......................... 382/228 |
| 6,411,670 B1 * | 6/2002 | Besson .......................... 378/4 |
| 7,102,348 B2 * | 9/2006 | Zhang et al. ................. 324/309 |
| 7,688,068 B2 * | 3/2010 | Beatty ......................... 324/307 |
| 2006/0028206 A1 | 2/2006 | Zhang et al. |
| 2008/0279433 A1 * | 11/2008 | Brau et al. .................. 382/131 |

OTHER PUBLICATIONS

"Advances in Locally Constrained k-Space-Based Parallel MRI," Samsonov et al. Magnetic Resonance in Medicine, vol. 55 (2006) pp. 431-436.
"Improved Data Reconstruction Method for GRAPPA," Wang et al., Magnetic Resonance in Medicine, vol. 54 (2005) pp. 738-742.

(Continued)

Primary Examiner—Brij B Shrivastav
(74) Attorney, Agent, or Firm—Schiff Hardin LLP

(57) ABSTRACT

In a method as well as a magnetic resonance tomography apparatus for implementation of such a method for improved sensitivity-encoded magnetic resonance imaging using a two-dimensional or three-dimensional acquisition coil array, two-dimensional or three-dimensional undersampling of k-space is undertaken by measurement of a number N of basic partial trajectories $\tau_n$ in k-space that in their entirety form a geometric arrangement of source points, a number M of different operators $C_m(\Delta \overline{K}_m)$ are determined, with each operator representing an algebraic transformation with which unmeasured target points at an interval $\Delta \overline{K}_m$ from one of the measured source points are synthesized from a number of measured source points, the operators $C_m(\Delta \overline{K}_m)$ are applied to at least one subset of the measured source points for at least partial completion of the magnetic resonance data set, and a largely artifact-free image is reconstructed in three-dimensional space on the basis of the measured source points and the synthesized data points.

9 Claims, 9 Drawing Sheets

OTHER PUBLICATIONS

"Auto-Calibrated Parallel Spiral Imaging," Heberlein et al., Magnetic Resonance in Medicine, vol. 55 (2006) pp. 619-625.

"k-t GRAPPA: A k-space Implementation for Dynamic MRI with High Reduction Factor," Huang et al., Magnetic Resonance in Medicine, vol. 54 (2005) pp. 1172-1184.

Autocalibrated Coil Sensitivity Estimation for Parallel Imaging, Griswold et al., NMR in Biomedicine, vol. 19 (2006) pp. 316-324.

"Encoding and Reconstruction in Parallel MRI," Pruessmann, NMR in Biomedicine, vol. 19 (2006) pp. 288-299.

* cited by examiner k-space trajectories comprising 2D-displaced radial lines (not through the k-space center) = "degenerate propeller"

Δϕ

C"

Calibration → C"

k-space trajectories comprising 2D-displaced radial lines (not through the k-space center) without parallelism (no propeller)

Calibration
→ C"

C"

METHOD AND APPARATUS FOR SENSITIVITY-ENCODED MAGNETIC RESONANCE IMAGING USING AN ACQUISITION COIL ARRAY

BACKGROUND OF THE INVENTION

1. Field of the Invention

The present invention generally concerns magnetic resonance tomography (MRT) as used in medicine for examination of patients. The present invention particularly concerns a method as well as a magnetic resonance tomography apparatus for implementation of such a method in which two-dimensional or three-dimensional sensitivity-encoded magnetic resonance imaging using an acquisition coil array for partially parallel acquisition (PPA) is employed for completion of under-sampled magnetic resonance data sets.

2. Description of the Prior Art

MRT is based on the physical phenomenon of nuclear magnetic resonance and has been successfully used as an imaging method for over 20 years in medicine and biophysics. In this examination modality the subject is exposed to a strong, constant magnetic field. The nuclear spins of the atoms in the subject, which were previously randomly oriented, thereby align. Radio-frequency energy can now excite these "ordered" nuclear spins to a specific oscillation. In MRT, this oscillation generates the actual measurement signal which is acquired by means of suitable reception coils. Non-homogeneous magnetic fields generated by gradient coils follow the measurement subject to be spatially coded in all three spatial directions. The method allows a free selection of the slice to be imaged, so slice images of the human body can be acquired in all directions. MRT as a slice imaging method in medical diagnostics is distinguished predominantly as a non-invasive examination method with a versatile contrast capability. Due to the excellent representation capability of soft tissue, MRT has developed into a method superior in many ways to x-ray computed tomography (CT). MRT today is based on the application of spin echo and gradient echo sequences that enable an excellent image quality with measurement times on the order of minutes.

The continuous technical development of the components of MRT apparatuses and the introduction of faster imaging sequences has opened more fields of use for MRT in medicine. Real-time imaging for supporting minimally-invasive surgery, functional imaging in neurology, and perfusion measurement in cardiology are only a few examples. In spite of the technical advances in the design of MRT apparatuses, the acquisition time of an MRT image remains the limiting factor for many applications of MRT in medical diagnostics. From a technical viewpoint (feasibility) and for reasons of patient protocol (stimulation and tissue heating), a limit is set on a further increase of the performance of MRT apparatuses with regard to the acquisition time. In recent years numerous efforts have therefore been made to further reduce the image measurement time.

One approach to shorten the acquisition time is to reduce the number of the measurement steps. In order to obtain a complete image from such a data set, either the missing data must be reconstructed with suitable algorithms or the incorrect image from the reduced data must be corrected.

The acquisition of the data in MRT occurs in a mathematical organization known as k-space (frequency domain). The MRT image in what is known as the image domain is linked with the MRT data in k-space by means of Fourier transformation. The spatial coding of the subject who spans k-space can ensue in various ways. A Cartesian sampling (i.e. a sampling in the form of straight parallel lines) or a per-projection sampling (i.e. a sampling running linearly through the k-space center) are most conventional. An arbitrary three-dimensional sampling is also possible, wherein the trajectories along which the sampling ensues can have arbitrary shape (for example spiral form, linear segments, propeller shape, etc.) and do not necessary have to intersect the k-space center. The coding generally ensues by means of gradients in all three spatial directions. Given Cartesian sampling, differentiation is made between the slice selection (establishes an acquisition slice in the subject, for example the z-axis), the frequency coding (establishes a direction in the slice, for example the x-axis) and the phase coding (determines the second dimension within the slice, for example the y-axis).

The acquisition method for projection reconstruction is a simple variant in which a gradient is used that is not successively increased and thus does not scan line-by-line in the Cartesian format, but rather is rotated around the sample. In each measurement step a projection is thus acquired from a specific direction through the entire sample, and thus a typical data set for the projection reconstruction in k-space as is, for example, presented in FIG. 4 by the projections (A), (B), (D) and (E). The entirety of the points corresponding to the acquired data in k-space is called a projection data set.

In a general three-dimensional acquisition method a suitable gradient switching can effect the scanning along different trajectories whose path (as noted) does not necessarily need to intersect the k-space center and which do not need to be geometrically correlated either in parallel or in any manner at all.

In contrast to Cartesian scanning, radial (or spiral) scanning of the frequency domain is advantageous particularly for the imaging moving subjects (such as the beating heart) because movement artifacts smear over the entire image field in the image reconstruction and thus do not obscure pathological findings. In Cartesian scanning of the frequency domain, interfering ghost images occur in the reconstructed image that usually appear as periodically repeating image structures in the phase coding direction. The longer (in comparison to Cartesian scanning) measurement time that is required for nominally equal spatial resolution is disadvantageous in the case of a non-Cartesian radial, spiral or arbitrary further two- or three-dimensional scanning of the frequency domain. In Cartesian scanning, the number of the phase coding steps $N_y$ (for example the number of the angle steps $N_\phi$ (the additional angle steps $N_\psi$ in 3D) given radial scanning) determines the measurement time. For the same spatial resolution, $$N_\phi = \frac{\pi}{2} N_y.$$

Most PPA methods for shortening the image measurement time in the case of Cartesian scanning are based on a reduction of the number of time-consuming phase coding steps $N_y$ and the use of a number of signal acquisition coils, known as "partially parallel acquisition" and designated as PPA. The transfer of this principle to data acquisition methods with radial (2D or 3D) scanning ensues by the number of time-consuming angle steps $N_\phi$ (or, respectively, $N_\theta$ and possibly $N_\Theta$) being reduced.

It is a requirement for PPA imaging that the k-space data be acquired not by a single coil, but rather by component coils arranged around the subject linearly, annularly or matrix-like in the form of a two-dimensional acquisition coil array, or cuboid-like, elliptically or spherically in the form of a three-dimensional coil array. As a consequence of their geometry, each of the spatially independent components of the coil array delivers certain spatial information which is used in order to achieve a complete spatial coding by a combination of the simultaneously acquired coil data. This means that, given radial k-space scanning, a number of "omitted" projections in k-space can be determined from a single acquired k-space projection.

PPA methods thus use spatial information that is contained in the components of a coil arrangement in order to replace missing spatial coding (via gradients). The image measurement time is thereby reduced corresponding to the ratio of the number of the partial measurements of the reduced data set to the number of the partial measurements of the complete data set. In a typical PPA acquisition only a fraction (½, ⅓, ¼, etc.) of the partial data sets is acquired in comparison to the conventional acquisition. A special algebraic reconstruction is then applied in order to computationally reconstruct the missing data and thereby to obtain the full field of view (FOV) image in a fraction of the time. The FOV is established by the average interval of the measurement values in k-space.

Known GRAPPA-like PPA methods generate unknown target points from measured source points, with the relative geometric arrangement of these points being fixed. The reconstruction of a number of missing data points occurs by parallel displacement of this basic geometric arrangement (Fourier shift theorem). In particular, an individual measurement value in k-space can be displaced by a specific distance in a specific spatial direction (for example by $n\Delta\bar{k}$, whereby (n+1) corresponds to the acceleration factor). The calibration (the finding of the coefficients that are necessary for the algebraic reconstruction) typically ensues on the basis of additional calibration measurements in which this same geometric arrangement of source points and target points is repeatedly contained. This is explained using FIG. 2 in the example of a simple three-dimensional Cartesian PPA imaging measurement:

The upper portion of FIG. 2 shows a Cartesian PPA scan orthogonal to the image plane with (for example) a horizontal 3D coding and (for example) a vertical phase coding. Each circle symbolizes a measurement line orthogonal to the image plane, whereby only every third line in the phase coding direction (not to be confused with the measurement line!) is actually measured. Measured measurement lines are shown in the form of filled circles; unmeasured (omitted) measurement lines are shown in the form of unfilled circles. The omission of two respective lines in the phase coding direction effects an acceleration factor of the measurement of n=3. Unmeasured lines can be algebraically reconstructed on the basis of one or more measured lines. A requirement for this is a calibration measurement in at least one partial region of the intended magnetic field in which no lines are omitted (see lower part of FIG. 2). On the basis of such a calibration measurement, an algebraic imaging rule can be found which maps what are known as source lines (right-hatched) to what are known as target lines (left-hatched). The type of the mapping—namely which source lines are mapped to which target lines—conforms with the geometry of the intended, PPA-reduced actual imaging measurement (top of FIG. 2). In the example of FIG. 2, four source lines from four adjacent measured phase coding lines are used for reconstruction of the target lines (horizontal hatching) between the second and the third measured phase coding lines. For clarification, the k-space region involved in the reconstruction is characterized by a boundary in the form of a block. The right-hatched source lines therein form the "support lines" that enable a reconstruction of the horizontally hatched, unmeasured target lines via linear combination. The greater the ratio between the number of the source lines and the number of the target lines, the more exact the result of the reconstruction.

In summary, a block defines a specific imaging rule in order to computationally reconstruct unmeasured k-space lines of an incompletely scanned k-space region corresponding to a PPA imaging. In the following such a block is designated (without limitation of generality) as a "PPA seed" or as a "GRAPPA seed".

The block or PPA seed in FIG. 2 is symmetrical and extends in total over ten measurement lines in the vertical direction. It has four source lines, each from different adjacent measured k-space lines, so the imaging rule leads only to a reconstruction of the measurement lines between the two average measured lines. By parallel displacement of the block according to FIG. 2 it is therefore possible to complete only the three average unmeasured double rows b, c and d. The PPA seed from FIG. 2 is not suitable for a completion of the rows a and e since it cannot be displaced beyond the shown k-space measurement region. A simple possible PPA seed for completion of the unmeasured border regions a and e would be, for example, a four-line block with a respective source line at the upper end and at the lower end. Such a block, however, represents a limitation with regard to the reconstruction precision since only two source lines are available for reconstruction of paired measurement lines.

It is a disadvantage of existing PPA methods that the calibration measurements require a significant additional measurement effort, in particular given non-Cartesian k-space trajectories.

It is likewise disadvantageous that such imaging or reconstruction rules (conventional PPA seed geometries) cannot be applied or transferred from Cartesian to non-Cartesian scanning trajectories, or can only be applied or transferred in a severely limited manner.

SUMMARY OF THE INVENTION

An object of the present invention is to provide a method in which additional measurements (calibration measurements) for precise detection of coil sensitivities can be foregone in order to shorten the total measurement time of a parallel acquisition method, in particular given non-Cartesian k-space scanning. The selection of the trajectory thereby occurs in connection with the selection of the geometric arrangement from PPA source points and target points or target lines in order to achieve an optimally efficient self-calibration.

This object is achieved according to the invention by a method for improved sensitivity-encoded magnetic resonance imaging using a two-dimensional or three-dimensional acquisition coil array, which includes the following steps.

Step 1: two-dimensional or three-dimensional (i.e. multi-dimensional) undersampling of k-space via measurement of a number N of basic partial trajectories $\tau_n$ in k-space that in their entirety form a geometric arrangement of source points, Step 2: determination of a number M of different operators $C_m(\Delta\bar{k}_m)$, wherein each operator represents an algebraic transformation via which unmeasured target points at an interval $\Delta\bar{k}_m$ from one of the measured source points are synthesized from a number of measured source points, Step 3: application of the operators $C_m(\Delta\bar{k}_m)$ to at least one subset of the measured source points for at least partial completion of the magnetic resonance data set, Step 4: reconstruction of a largely artifact-free image in three-dimensional space on the basis of the measured source points and the synthesized data points.

In accordance with the invention, the operators are advantageously (but not necessarily) determined without the aid of sensitivity information of the acquisition coil array acquired by means of calibration measurements.

The invention is thereby concerned with basic partial trajectories $\tau_n$ that proceed straight, at least in segments, in k-space without forming a Cartesian scan nor a radial scan, as well as basic partial trajectories $\tau_n$ that have a completely straight path but do not pass through the k-space center.

According to the invention the operators $C_m(\Delta \overline{K}_m)$ are determined by solving overdetermined equation systems from $\Delta \overline{F}, \overline{F}$ and C with the pseudo-inverse $\overline{F}'(\overline{F}\overline{F}')^{-1}$, whereby $\Delta \overline{F}$ respectively represents the vector of measured target data, $\overline{F}$ represents the vector of measured source data and $\overline{F}'$ represents the transposed vector at $\overline{F}$.

A largely completed raw data set in k-space is advantageously acquired by calculating further synthesized partial trajectories $\tau_{n,m}$ that are displaced in various directions by $\Delta \overline{K}_m$ on the basis of the determined operators $C_m(\Delta \overline{K}_m)$ and the measured basic partial trajectories $\tau_n$. In a first embodiment of the invention the entire calculated partial trajectories $\tau_n, \tau_{n,m}$ are used for the reconstruction of the image. In a second embodiments only parts of the calculated synthesized partial trajectories $\tau_{n,m}$ are used for the reconstruction of the image.

The above object also is achieved in accordance with the invention by a magnetic resonance tomography apparatus which is designed for implementation of a method as described above.

The above object also is achieved in accordance with the invention by a computer software product (a computer-readable medium encoded with a data structure) that causes a method as described above to be executed when it runs on a computer connected with a nuclear magnetic resonance tomography apparatus.

DESCRIPTION OF THE PREFERRED EMBODIMENTS

Figure 1:
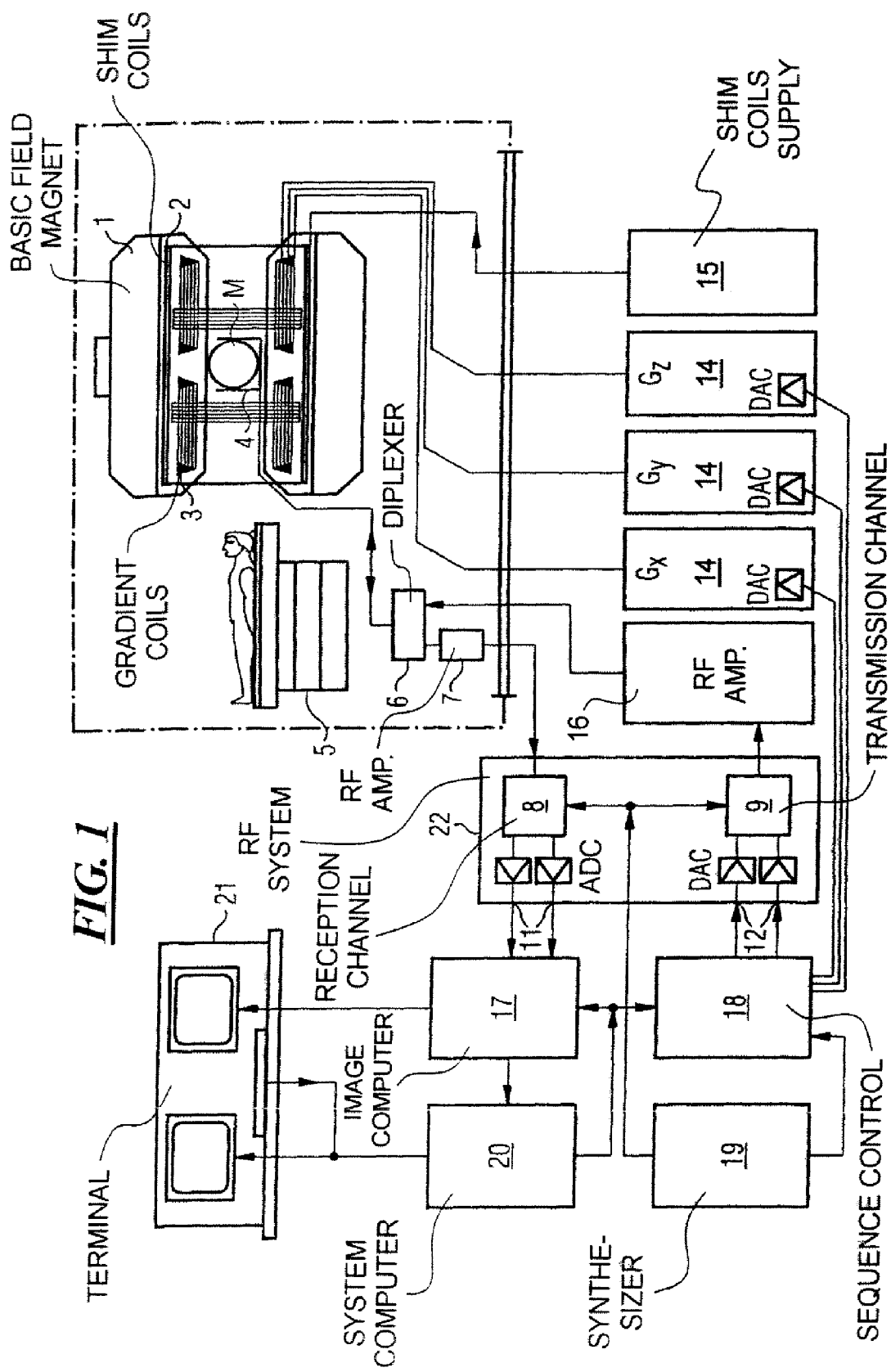
FIG. 1 illustrates a magnetic resonance tomography apparatus constructed and operating according to the present invention.
Figure 2:
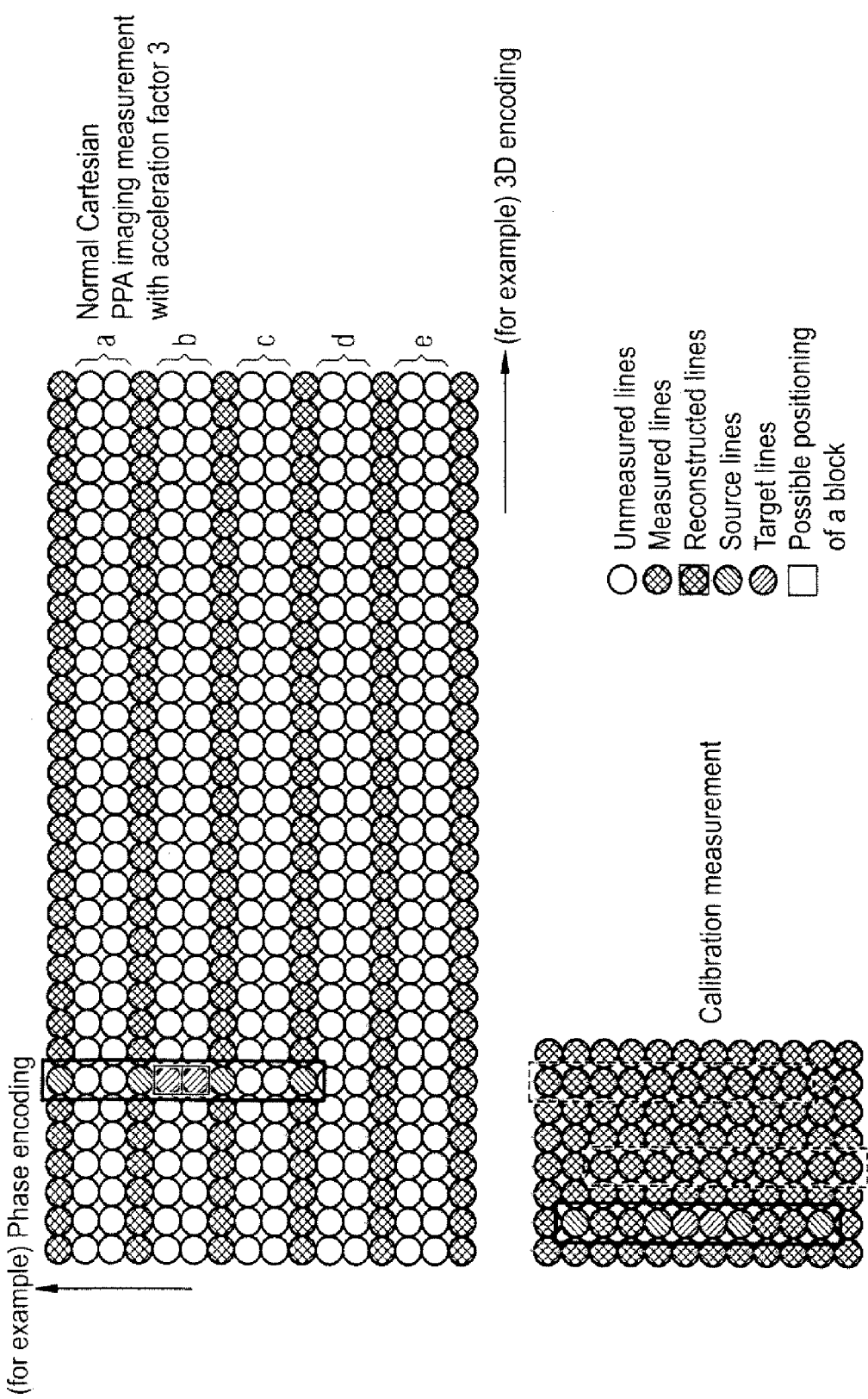
FIG. 2 illustrates a Cartesian PPA imaging measurement with a necessary calibration measurement according to the prior art.

FIG. 1 schematically illustrates a magnetic resonance imaging or tomography apparatus for generation of a magnetic resonance image of a subject according to the present invention. The basic design of the magnetic resonance tomography apparatus corresponds to that of a conventional tomography apparatus, but with the important differences discussed below. A basic field magnet 1 generates a temporally-constant strong magnetic field for polarization or alignment of the nuclear spins in the examination region of a subject such as, for example, of a part of a human body to be examined. The high homogeneity of the basic magnetic field necessary for the magnetic resonance measurement is defined in a typically spherical measurement volume MV, into which the parts of the human body to be examined are introduced. To support the homogeneity requirements, and in particular to eliminate temporally invariable influences, shim plates made of ferromagnetic material are mounted at a suitable location. Temporally-variable influences are countered by shim coils 2 that are activated by a shim power supply 15.

A cylindrical gradient coil system 3 that has three sub-windings is used in the basic field magnet 1. Each sub-winding is supplied with current from an amplifier for generation of a linear gradient field in the respective direction of the Cartesian coordinate system. The first sub-coil of the gradient field system 3 generates a gradient $G_x$ in the x-direction, the second sub-coil generates a gradient $G_y$ in the y-direction and the third sub-coil generates a gradient $G_z$ in the z-direction. Each amplifier includes a digital-analog converter that is activated by a sequence controller 18 for accurately timed generation of gradient pulses.

In order to be able to implement PPA measurements with an improved signal-to-noise ratio (SNR) with an MRT apparatus, it is currently standard, rather than using a single coil, to use an arrangement of a number of coils in the PPA coding direction, in particular in the phase coding direction, generally the y-direction. These arrangements, known as component coils, are connected into a coil array, whereby overlapping coil images can be acquired. If the acquisition time is not to be extended, the coils of a coil array must acquire simultaneously. Each coil consequently requires its own receiver which, as already mentioned, includes a preamplifier, mixer and analog-digital converter. At present arrays with a maximum of 32 individual coils are the rule.

Located within the gradient field system 3 is a radio-frequency antenna 4 that converts the radio-frequency pulses emitted by a radio-frequency power amplifier into an alternating magnetic field for excitation of the nuclei and alignment of the nuclear spins of the subject to be examined or of the region of the subject to be examined. The radio-frequency antenna 4 includes one or more RF transmission coils and a number of RF reception coils in the form of an annular, linear or matrix-like arrangement of component coils. The alternating field originating from the processing nuclear spins (i.e. normally the nuclear spin echo signals caused by a pulse sequence composed of one or more radio-frequency pulses and one or more gradient pulses) is also converted by the RF reception coils of the radio-frequency antenna 4 into a voltage that is supplied via an amplifier 7 to a radio-frequency reception channel 8 of a radio-frequency system 22. The radio-frequency system 22 furthermore has a transmission channel 9 in which are generated the radio-frequency pulses for the excitation of the nuclear magnetic resonance. The respective radio-frequency pulses are digitally represented in the sequence controller 18 as a series of complex numbers based on a pulse sequence predetermined by the system computer 20. This number series is supplied as a real part and an imaginary part via respective inputs 12 to a digital-analog converter in the radio-frequency system 22 and from this to a transmission channel 9. In the transmission channel 9, the pulse sequences are modulated on a radio-frequency carrier signal whose basic frequency corresponds to the resonance frequency of the nuclear spins in the measurement volume.

The switch-over from transmission mode to reception made ensues via a transmission-reception diplexer 6. The RF transmission coil of the radio-frequency antenna 4 radiates the radio-frequency pulses for excitation of the nuclear spins into the measurement volume MV for excitation of the nuclear spins and samples resulting echo signals via the RF acquisition coils. The acquired magnetic resonance signals are phase-sensitively demodulated in the acquisition channel 8' (first demodulator) of the radio frequency system 22 and are converted into the real part and the imaginary part of the measurement signal via a respective analog-digital converters. An image is reconstructed by an image computer 17 from the measurement data so acquired. The administration of the measurement data, the image data and the control programs ensues via the system computer 20. Based on a protocol with control programs, the sequence controller 18 monitors the generation of the respective desired pulse sequences and the corresponding sampling of k-space. The sequence controller 18 in particular controls the accurately timed switching of the gradients, the emission of the radio-frequency pulses with defined phase and amplitude and the acquisition of the nuclear magnetic resonance signals. The time basis for the radio-frequency system 22 and the sequence controller 18 is provided by a synthesizer 19. The selection of corresponding control programs for generation of a magnetic resonance image as well as the representation of the generated magnetic resonance image ensues via a terminal 21 that has a keyboard as well as one or more screens.

Figure 4:
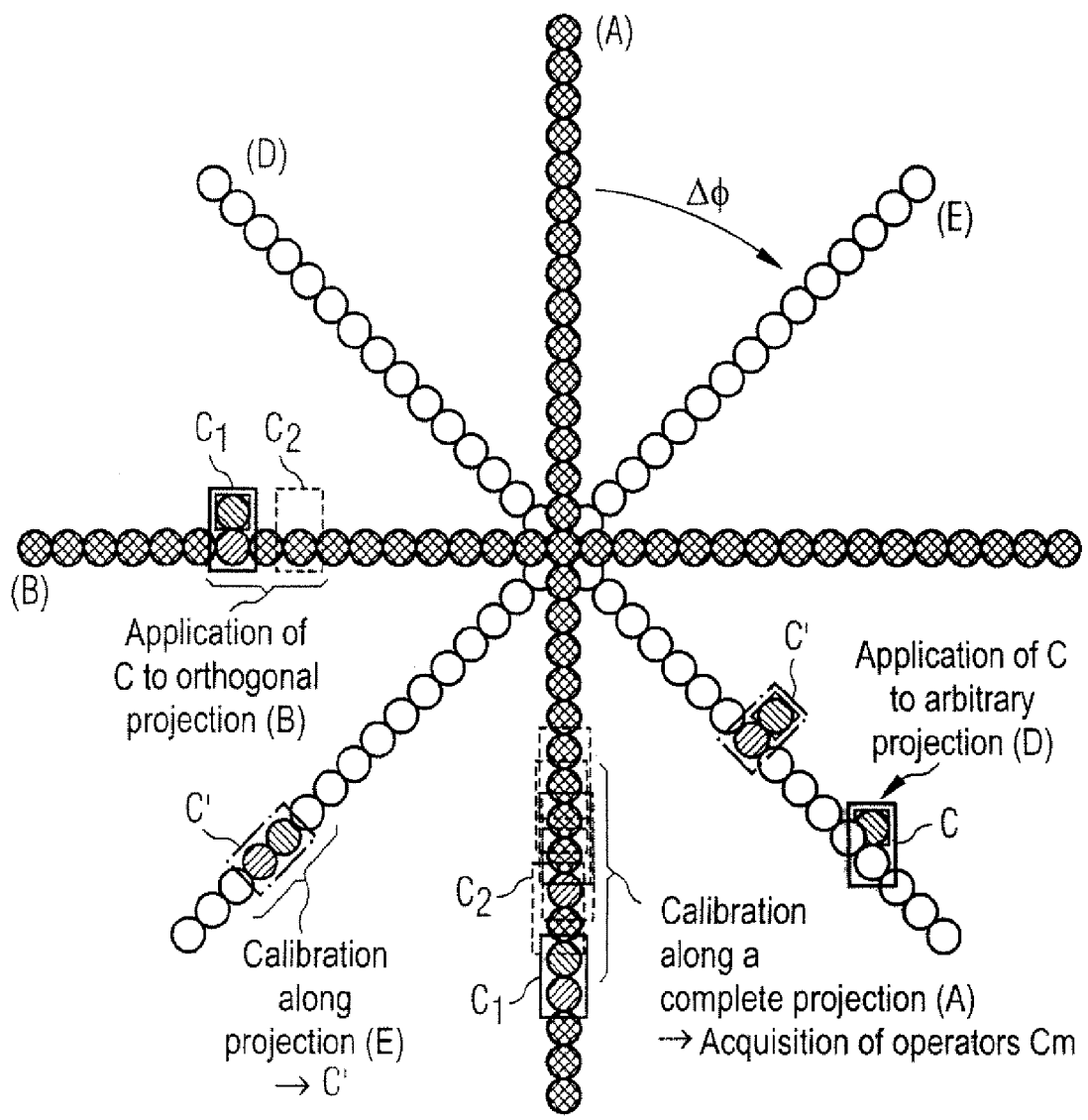
FIG. 4 shows the determination of operators by calibration along a projection and application of the operator to a projection orthogonal to the calibration projection or application of the operator to an arbitrary projection.

The present invention is a PPA method with non-Cartesian scanning with which artifact-free image reconstruction is possible without explicit measurement of the coil profiles and without acquisition of additional calibration information, so the measurement time is substantially shortened. The method is based on a matching or harmonization of the k-space geometry of the acquisition and the PPA reconstruction seed with each other. In the further discussion herein, the PPA reconstruction seeds are designated as operators, corresponding to their algebraic translational function. The image acquisition is thus accelerated by additional reference measurements to determine the coil sensitivities being avoided. This technique (such as is realized, for example, by programming of the system computer 20 or the sequence controller 18 in the magnetic resonance apparatus shown in FIG. 1) is roughly based on the following procedure, schematically shown in FIG. 4:

In a step 1 an undersampling of k-space initially ensues with measurement of a reduced data set. In the case of FIG. 4 the reduced data set has a number of basic partial trajectories (A), (6), (D) and (E). The measurement advantageously ensues by a progressive rotation of the first basic partial trajectory (A) by a respective step angle $\Delta\phi$ in the azimuthal direction given a constant elevation angle $\psi$ and by a step angle $\Delta\psi$ in the elevation direction. For example, in FIG. 4 $\Delta\psi$ is 45° (a rotation in the elevation angle by step angle $\Delta\psi$ is not shown in FIG. 4). The acquisition of the measurement data thereby ensues by means of component coils that are arranged linearly around the subject in all employed directions of k-space or annularly or matrix-like around the subject. The step angles $\Delta\phi$, $\Delta\psi$ are generally dimensioned such that an undersampling of k-space ensues. As already mentioned, an image of the k-space data as is, for example, exemplarily shown in FIG. 4 results given $\Delta\phi=45°$ and $\Delta\psi=0$. Undersampling of a data set means that too few data have been acquired with a single acquisition channel (or a single component coil) in order to be able to reconstruct an artifact-free image in three-dimensional space therefrom. Depending on the number of the omitted k-space data, such an undersampling achieves a distinct reduction of the measurement time.

In further steps of the inventive method further partial data sets are obtained purely by computation on the basis of the measured undersampled data set with using the information in the M acquisition channels (component coils), which further partial data sets form partial trajectories displaced in k-space between the measured basic partial trajectories and complete the undersampled data set insofar as an artifact-free image reconstruction in three-dimensional space is enabled. The simplest conceivable PPA seed geometry is used as an example: a single source point and, depending on the desired acceleration factor, one or more target points. More complex geometries of the PPA seed are treated analogously, but lead to limitations in the selection of suitable k-space trajectories.

According to FIG. 4, the measured basic partial trajectory (A) is initially considered without limitation of generality. In step 2, algebraic operators (PPA seeds in the form of coefficient matrices $C_m(n\Delta k)$) are calculated from the values $G_0(q_0, q_0', \ldots)$ of the basic partial trajectory (A) measured in step 1, which algebraic operators are subsequently, respectively applied in a step 3 to the corresponding individual points $q_0$, $q_0', \ldots$ of the basic partial trajectory (B) such that a point set arises that forms partial trajectories further displaced by $n\Delta k$ relative to (B). Shown in FIG. 4 is the special case for $\Delta\phi=90°$ and n=1 in which the operators $C_m(\Delta k)$ are calculated solely from the measured values of the partial trajectory (A). Thus this calculation thus can be considered as a calibration, but it does not require additional measurement time.

This procedure (implementation of the steps 1 through 3) is applied to all measured basic partial trajectories of the undersampled projection data set, whereby a value set of k-space is formed that no longer needs to be explicitly measured, and whereby a measurement time reduction results given equivalent image quality of the image reconstructed in three-dimensional space. The reconstruction of the image in three-dimensional space ensues in a last step 4 on the basis of k-space completed purely computationally according to steps 1 through 3.

Theoretically, each operator of a basic partial trajectory can be applied to any other basic partial trajectory as long as the geometric arrangement of the data points is compatible with the PPA seed, which, for example, is always provided given a single source point. However, as can be easily recognized using FIG. 4, this is connected with more or less considerable efficiency loss. For example, the application of the operators $C_m$ of the partial trajectories (A) to the partial trajectory (D) generates a further partial trajectory that overlaps with (D). According to the inventive method, the greatest possible efficiency in the sense of a completion of k-space is thus provided when operators of linear partial segments are applied to other linear partial segments including (with these linear partial segments) an angle of 90° (see operator C' of the partial trajectory (E) applied to partial trajectory (D)). This also applies for the three-dimensional case.

Figure 5:
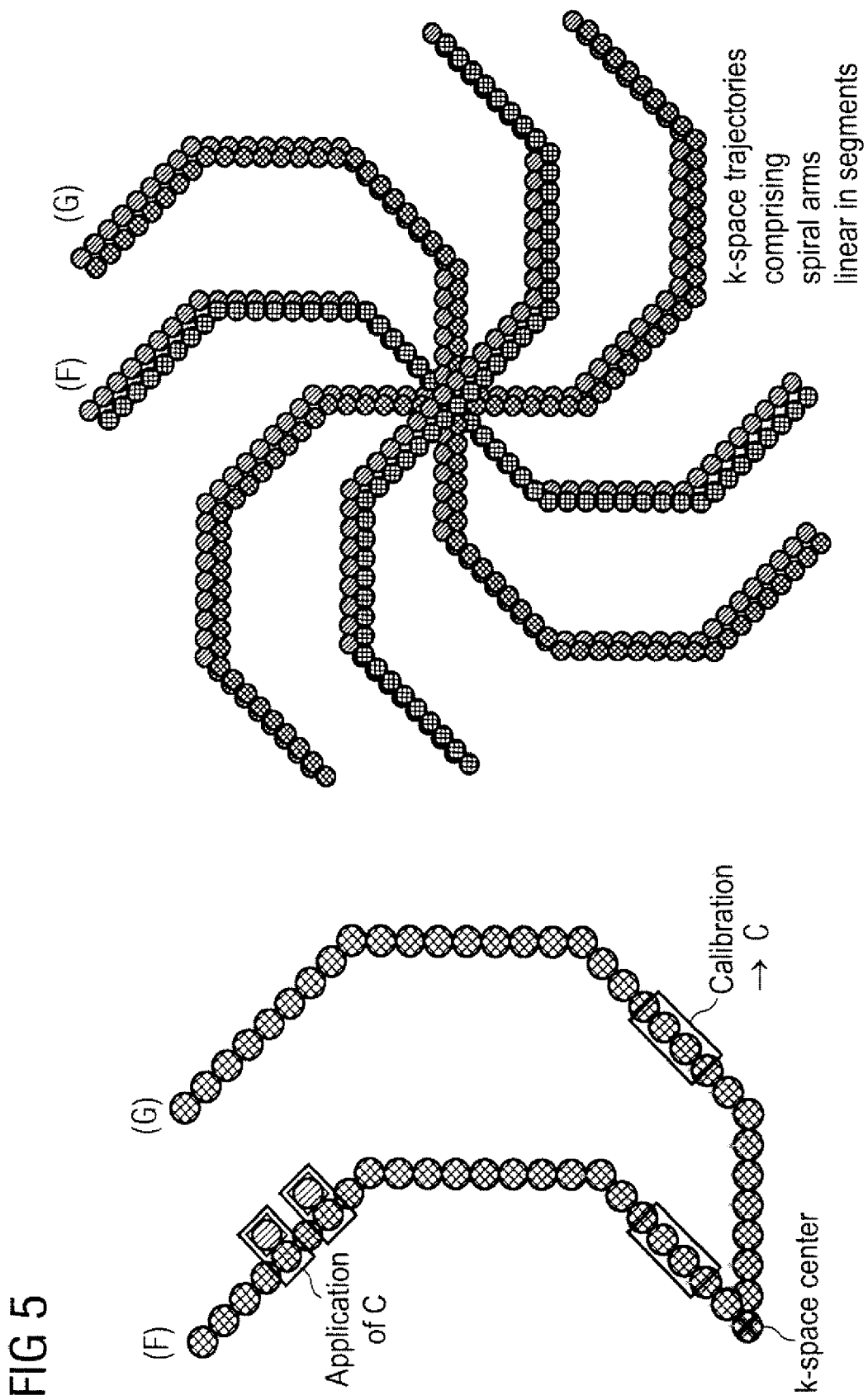
FIG. 5 shows the application of an operator to k-space trajectories having spiral arms that are linear in segments.

This can be seen from FIG. 5, in which k-space trajectories are shown that have spiral arms which are linear in segments. It can easily be seen that, for each partial segment of a specific spiral arm, a linear partial segment rotated by 90° relative to this exists either for the same spiral arm or a different spiral arm. This means that operators C can be generated in each linear partial segment, which operators, when applied to a corresponding linear partial segment rotated by 90°, synthesize a new partial segment parallel to this partial segment rotated by 90°.

Only two-component operators that generate a single adjacent target point from only one support point (source point) are respectively shown in FIGS. 4 and 5. Two-component operators represent the smallest unit of possible PPA seeds. The next largest unit would be an operator that generates a target line from two adjacent source lines or even an operator that generates two target lines from one source line. An operator of the latter cited type is shown in the right portion of FIG. 3 (operator C).

Figure 3:
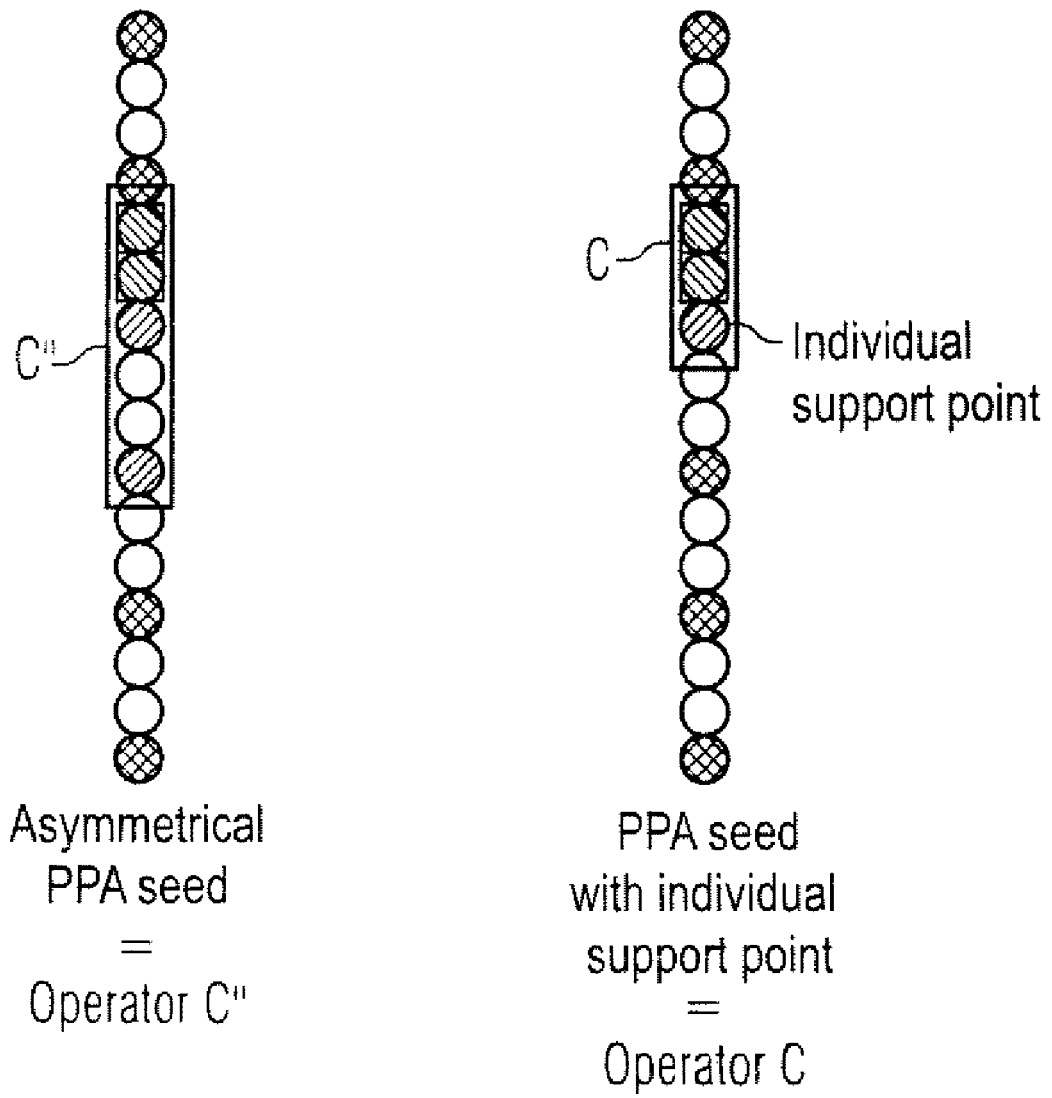
FIG. 3 shows an asymmetrical PPA seed with two source lines as well as an operator in the form of a PPA seed with individual support point.

A more complex four-component operator C" is shown in the left portion of FIG. 3, which four-component operator C" generates (synthesizes) from two non-adjacent source lines two adjacent target lines situated outside of the source lines. Such an operator exhibits a greater reconstruction precision since multiple (namely two) source lines serve as a reconstruction basis. However, the application of such an operator C" requires a k-space trajectory topography that has corresponding congruent regions in corresponding linear partial segments of the operator geometry, from which corresponding congruent regions the operator is obtained by calibration, and that also includes other, additional partial segments to which the operator can be applied. The k-space trajectory topography should also be such that the application of the operator C" synthesizes further trajectories that optimally effectively cover the unmeasured k-space region and compensate for the original undersampling.

Figure 6:
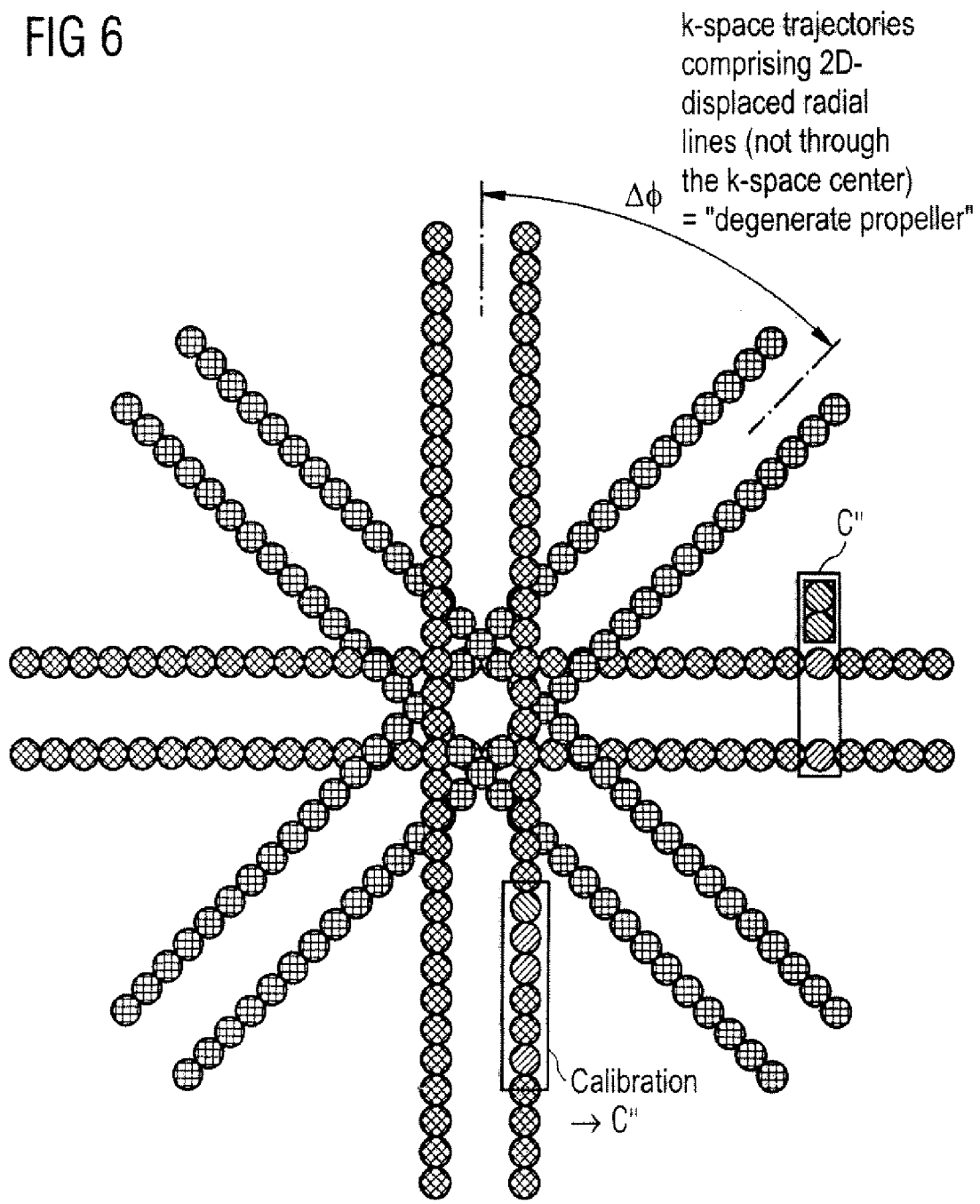
FIG. 6 shows k-space trajectories having 2D-displaced radial lines.
Figure 7:
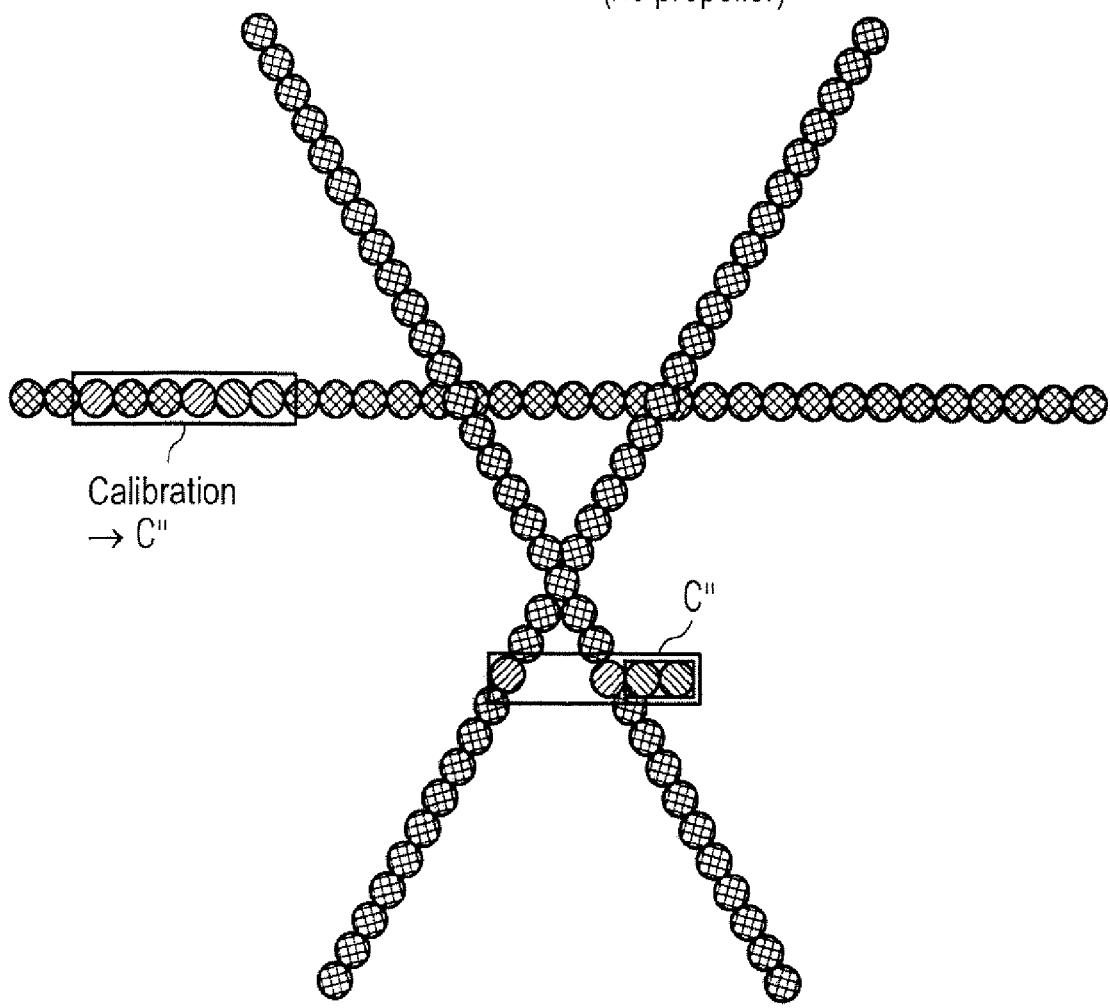
FIG. 7 shows k-space trajectories having 2D-displaced radial lines without parallelism.

Such a k-space trajectory topography is shown, for example, present in FIGS. 6 and 7. FIG. 6 shows k-space trajectories (partial trajectories) that comprise symmetrical projections or, respectively, radial lines displaced around the k-space center and inasmuch represent "degenerate propeller trajectories". Overall the k-space region should be assessed as undersampled. The interval of two parallel partial trajectories is approximately two measurement lines, such that the asymmetrical operator C" (FIG. 3) can be applied to such a parallel pair in order to synthesize two further external parallel trajectories (further partial trajectories). The generation of the operator C" (calibration) advantageously ensues beforehand in the longitudinal direction of the corresponding (rotated by 90°) trajectory pair. The generation and application of two antiparallel C" operators to each parallel pair enables the undersampled k-space between the parallel pairs rotated relative to one another by the angle $\Delta\phi$ to be completed. To complete k-space between two parallel partial trajectories (in the event that this is necessary at all and the Nyquist criterion cannot be satisfied), a symmetrical operator can be used having source lines that exhibit the trajectory interval and that generate the k-space lines situated between the source lines.

A further application possibility of the C" operator from FIG. 3 is the severely simplified k-space undersampling according to FIG. 7. The k-space trajectories are 2D-displaced, non-parallel radial lines that do not pass through the k-space center. Here as well the application of the C" operator enables the synthesis of two immediately adjacent partial trajectories, however to a limited degree since efficacy is forfeited due to the overlapping of the parallel partial trajectories (due to lacking 90° geometry).

In summary, based on FIGS. 3 through 7, the basis of the invention is to combine possible operator geometries with possible trajectory geometries in the most effective way in the sense of a PPA-k-space undersampling (based on self-calibration). Optimally many trajectory syntheses with optimally few operators produce the best possible quality of the reconstructed k-space region.

The more complex the geometry of the undersampling (symmetry loss of the k-space partial trajectories), the simpler the operator geometry that must be selected, with the greatest possible tolerance of the synthesis being present with the simplest operator geometry (a source line with one adjacent target line).

Figure 8:
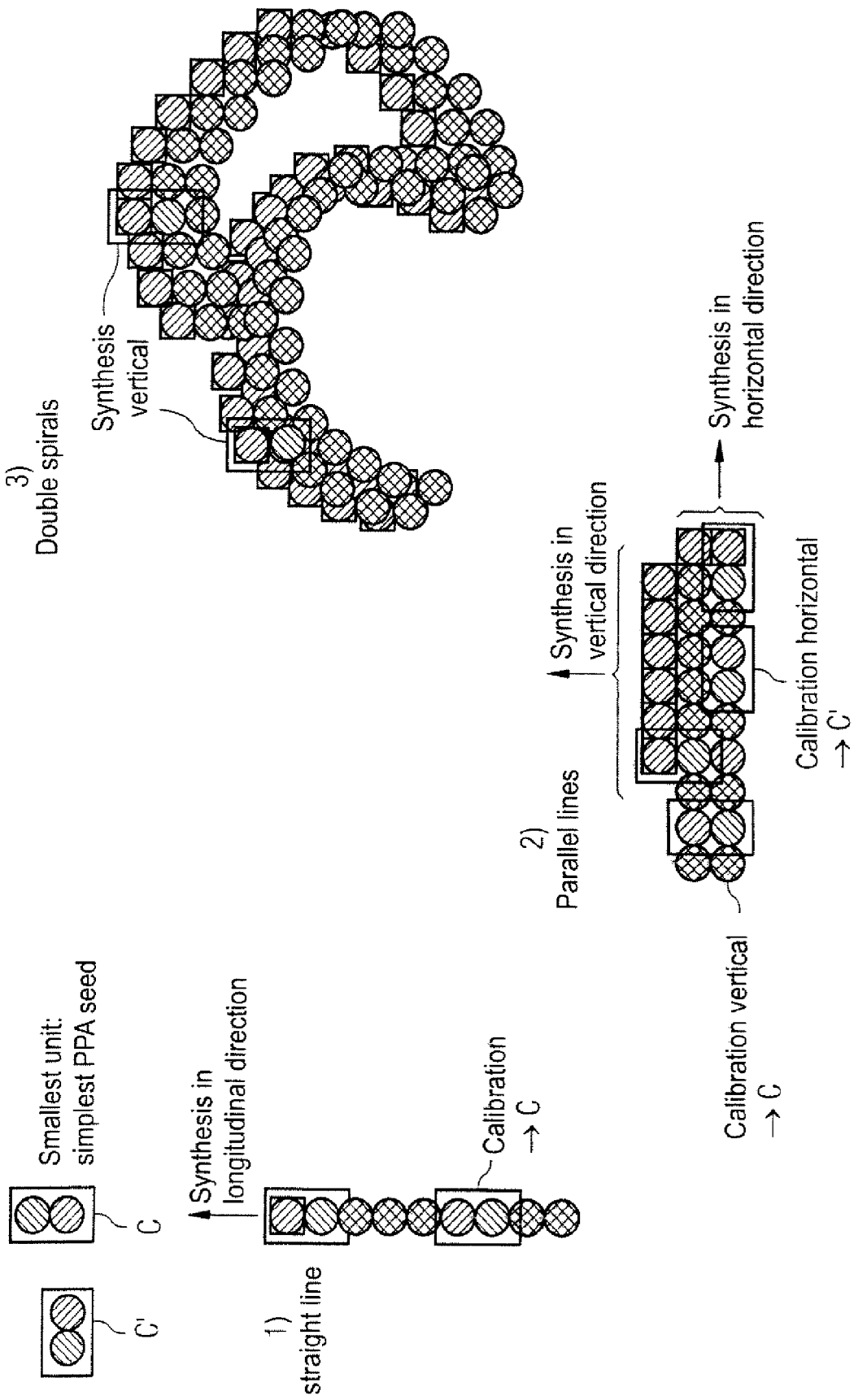
FIG. 8 shows different possibilities of the trajectory synthesis on the basis of a simple two-component operator (PPA seed).

This is illustrated again using FIG. 8: the smallest operator unit, a two-component PPA seed C or, respectively, C', forms the basis of a vertical or, respectively, horizontal synthesis around a k-space line.

For single-component synthesis of a straight line 1) in the longitudinal direction, at least three measurement points of the line are required: two additional measured points/measured lines for C-generation and one measurement point/measurement line as a source point/source line for the synthesis.

For single-component synthesis of adjacent parallel lines 2), a vertical calibration generates an operator C for single-component synthesis in the vertical direction or a horizontal calibration generates an operator C' for single-component synthesis in the horizontal direction.

A single-component synthesis of an arbitrary (double) spiral in, for example, a vertical direction 3) requires a certain minimum width of the measured trajectory (at least two vertical measured points/line) in order to be able to effect both the calibration and the synthesis with an operator C.

Last, the inventive synthesis of a three-dimensional undersampled k-space should be considered.

Figure 9:
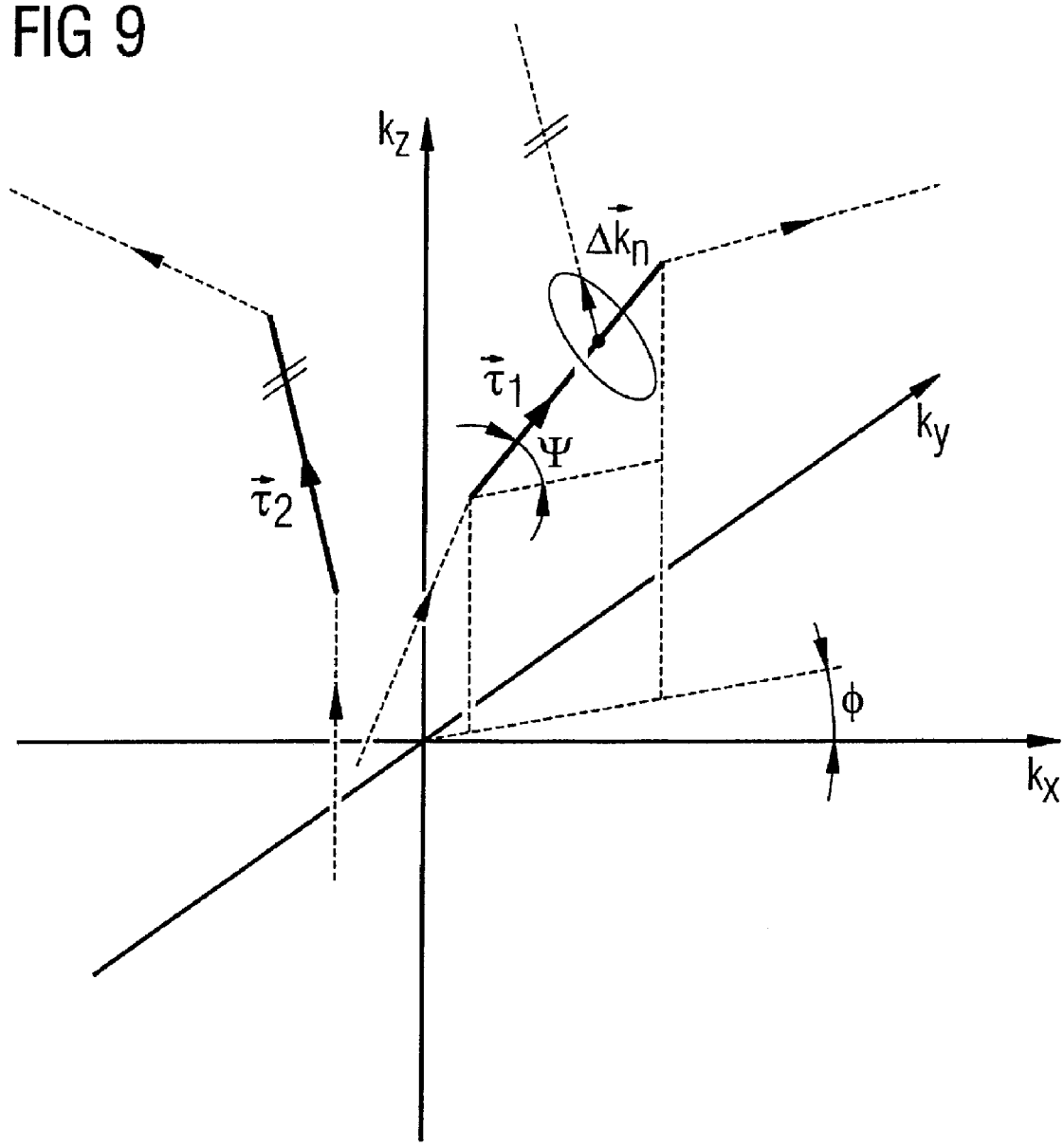
FIG. 9 schematically shows a trajectory synthesis in three-dimensional k-space.

FIG. 9 serves for explanation of the employed k-space geometries or k-space directions for the simple case of a straight line segment $\tau_1$ of a basic partial trajectory to be in the three-dimensional case (3D case). The spatial direction of $\tau_1$ is provided by the azimuthal angle $\phi$ and the elevation angle $\psi$ and is clarified by the use of a vector notation $\bar{\tau}_1$ ($\tau_1$ as a vector). An efficient possibility for the synthesis of measurement data on the basis of $\bar{\tau}_1$ occurs through an algebraic operator $C_n$ (PPA seed with a single source point) with which a displacement vector or synthesis vector $\Delta\bar{k}_n$ perpendicular to $\bar{\tau}_1$ is associated. The orthogonality of these two vectors ($\angle(\bar{\tau}_1, \Delta\bar{k}_n) = 90°$) can be mathematically described as $$\bar{\tau}_1 \cdot \Delta\bar{k}_n = 0.$$

Small to medium deviations from this right angle are possible with corresponding efficiency loss.

All other segments of partial trajectories which have the same spatial direction as $\Delta\bar{k}_n$ can serve as calibration data for the operator with the direction $\Delta\bar{k}_n$; for example, in FIG. 9 the partial trajectory $\bar{\tau}_2$ thus applies for the $\angle(\bar{\tau}_2, \Delta\bar{k}_n) = 0$, or $$\bar{\tau}_2 \cdot \Delta\bar{k}_n = |\bar{\tau}_2| \cdot |\Delta\bar{k}_n|.$$

A per-segment rectilinearity of partial trajectory $\bar{\tau}_2$ or further partial trajectories with the same spatial direction is necessary for the stable calculation of the coefficients of the operator $C_n$, which here represents a special case with a single source point.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance tomography apparatus comprising:
   a magnetic resonance data acquisition system configured to interact with a subject to acquire measured, raw magnetic resonance data from the subject;
   a computer that enters said measured, raw magnetic resonance data into k-space by multi-dimensionally undersampling k-space along a plurality N of basic partial trajectories $\tau_o$ in k-space, said N basic partial trajectories $\tau_o$, in combination, forming a geometric arrangement of source points, and that determines a plurality M of different operators $C_m(\Delta \vec{k}_m)$, with each operator representing an algebraic transformation through which unmeasured target points at an interval $\Delta \vec{k}_n$ from one of said source points are synthesized from a plurality of said source points, and that applies said operators $C_m(\Delta \vec{k}_m)$ to at least one subset of said source points for at least partial completion of a magnetic resonance data set; and
   an image reconstruction computer that reconstructs substantially artifact-free image in three-dimensional space from said source points and said synthesized target points in said magnetic resonance data set.

2. A magnetic resonance tomography apparatus as claimed in claim 1, wherein said computer determines said plurality M of different operators $C_m(\Delta \vec{k}_m)$ without sensitivity information of said acquisition coil array acquired by a calibration measurement.

3. A magnetic resonance tomography apparatus as claimed in claim 1, wherein said computer selects said plurality n of basic partial trajectories $\tau_o$ to proceed straight, at least in segments, in k-space in a scan that is non-Cartesian and non-radial.

4. A magnetic resonance tomography apparatus as claimed in claim 1, wherein said computer selects said plurality n of basic partial trajectories $\tau_o$ to proceed completely straight in k-space without passing through a center of k-space.

5. A magnetic resonance tomography apparatus as claimed in claim 1, wherein said computer determines said plurality M of different operators $C_m(\Delta \vec{k}_m)$ by solving overdetermined equation systems from $\Delta F, F$ and $C$ with the pseudo-inverse $F'(\overrightarrow{FF'})^{-1}$, wherein $\Delta F$ represents a vector of said target data and $F$ represents as vector of said source data.

6. A magnetic resonance tomography apparatus as claimed in claim 1, wherein said computer substantially completes said magnetic resonance data set in k-space by automatically electronically calculating further synthesized partial trajectories $\tau_{o,m}$ displaced in different directions by $\Delta \vec{k}_m$ based on said plurality M of different operators $C_m(\Delta \vec{k}_m)$ and said plurality N of basic partial trajectories $\tau_o$.

7. A magnetic resonance tomography apparatus as claimed in claim 1, wherein said computer reconstructs said image using an entirety of said partial trajectories $\tau_o$, $\tau_m$.

8. A magnetic resonance tomography apparatus as claimed in claim 1, wherein said computer reconstructs said image using only portions of said further synthesized partial trajectories $\tau_{o,m}$.

9. A computer-readable medium encoded with a data structure for use with a magnetic resonance data acquisition system configured to interact with a subject to acquire measured, raw magnetic resonance data from the subject, and a computer into which said medium is loadable, said data structure causing said computer to:
   enter said measured, raw magnetic resonance data into k-space by multi-dimensionally undersampling k-space along a plurality N of basic partial trajectories $\tau_o$ in k-space, said N basic partial trajectories $\tau_o$, in combination, forming a geometric arrangement of source points;
   determine a plurality M of different operators $C_m(\Delta \vec{k}_m)$, with each operator representing an algebraic transformation through which unmeasured target points at an interval $\Delta \vec{k}_n$ from one of said source points are synthesized from a plurality of said source points;
   apply said operators $C_m(\Delta \vec{k}_m)$ to at least one subset of said source points for at least partial completion of a magnetic resonance data set; and
   make said magnetic resonance data set available for reconstruction of a substantially artifact-free image in three-dimensional space from said source points and said synthesized target points in said magnetic resonance data set.

* * * * *